United States Patent
Guldi et al.

(10) Patent No.: US 7,171,035 B2
(45) Date of Patent: Jan. 30, 2007

(54) ALIGNMENT MARK FOR E-BEAM INSPECTION OF A SEMICONDUCTOR WAFER

(75) Inventors: Richard L. Guldi, Dallas, TX (US); Karanpreet Chahal, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 756 days.

(21) Appl. No.: 10/288,990

(22) Filed: Nov. 6, 2002

(65) Prior Publication Data

US 2004/0086172 A1   May 6, 2004

(51) Int. Cl.
*G06K 9/00* (2006.01)
*H01L 23/544* (2006.01)

(52) U.S. Cl. ............... 382/145; 257/620; 257/E23.179
(58) Field of Classification Search ............... 257/620, 257/E23.179; 382/145
See application file for complete search history.

(56) References Cited

U.S. PATENT DOCUMENTS

| | | | | |
|---|---|---|---|---|
| 4,327,292 A | * | 4/1982 | Wang et al. | 250/491.1 |
| 4,640,619 A | * | 2/1987 | Edmark, III | 356/625 |
| 4,642,672 A | * | 2/1987 | Kitakata | 257/797 |
| 4,758,089 A | * | 7/1988 | Yokokura et al. | 356/458 |
| 4,803,644 A | * | 2/1989 | Frazier et al. | 702/150 |
| 4,937,618 A | * | 6/1990 | Ayata et al. | 355/43 |
| 5,124,927 A | * | 6/1992 | Hopewell et al. | 700/121 |
| 5,405,810 A | * | 4/1995 | Mizuno et al. | 438/16 |
| 5,545,570 A | * | 8/1996 | Chung et al. | 438/703 |
| 5,570,405 A | * | 10/1996 | Chan et al. | 378/35 |
| 5,777,392 A | * | 7/1998 | Fujii | 257/797 |
| 5,869,383 A | * | 2/1999 | Chien et al. | 438/401 |
| 6,118,128 A | * | 9/2000 | Kojima | 250/491.1 |
| 6,156,243 A | * | 12/2000 | Kosuga et al. | 264/2.5 |
| 6,481,003 B1 | * | 11/2002 | Maeda | 716/21 |
| 6,486,954 B1 | * | 11/2002 | Mieher et al. | 356/401 |
| 6,638,831 B1 | * | 10/2003 | Roberts et al. | 438/401 |
| 2001/0008442 A1 | * | 7/2001 | Miyake | 355/53 |

* cited by examiner

*Primary Examiner*—Bhavesh M. Mehta
*Assistant Examiner*—Utpal Shah
(74) *Attorney, Agent, or Firm*—W. James Brady; Frederick J. Telecky, Jr.

(57) ABSTRACT

An alignment mark to be used in conjunction with e-beam imaging to identify specific feature locations on a chip including a unique "L" shaped pattern of geometric features, which is easily detected by the recognition system of e-beam imaging equipment, and is located in close proximity to the specific circuit features under investigation at each level to be inspected. The requirements for an alignment mark design which is recognizable by state-of-the-art e-beam imaging systems are enumerated, as well as the methodology for application. The alignment marks which are included at each critical step add no cost to wafer processing, and any design cost is easily overcome by reduction in process development time by using defect learning.

4 Claims, 4 Drawing Sheets

FIG. 7

| STEP 1 | DEFINE ALIGNMENT MARK REQUIREMENTS | A) SIZE<br>B) CLEAR AREA<br>C) MULTIPLE FEATURES AND 90 DEGREE ANGLES<br>D) MINIMUM DESIGN RULES |
|---|---|---|
| STEP 2 | IDENTIFY LOCATION | A) CLOSE PROXIMITY TO CRITICAL CIRCUITRY<br>B) DUPLICATE MARKS |
| STEP 3 | MASK DESIGN | INCLUDE ALIGNMENT MARK AT EACH CRITICAL LEVEL |
| STEP 4 | WAFER PROCESS | FULLY PROCESS ALIGNMENT MARK |
| STEP 5 | DEFECT INSPECTION | REFERENCE DEFECT LOCATION TO ALIGNMENT MARK |

ALIGNMENT MARK FOR E-BEAM INSPECTION OF A SEMICONDUCTOR WAFER

FIELD OF THE INVENTION

The present invention relates generally to alignment marks on semiconductor wafers, and more particularly to alignment marks used in connection with e-beam inspection for wafer defects.

BACKGROUND OF THE INVENTION

As employed in the fabrication of semiconductor wafers, photolithographic processes involve the use of a mask to define desired circuit patterns. The mask is precisely aligned with a wafer, or with a pattern previously formed on the wafer. In order to ensure proper placement and dimensions of the image, a pattern of alignment marks is included in the mask design, and it is typically placed in the scribe streets between the individual chips, so as to avoid encroachment into the space used for active circuitry. "Alignment mark" is a term referring to a set of defined geometric shapes or images.

As the number of individual circuits on an integrated circuit has increased, and the feature sizes have shrunk, multiple layers of insulating and conducting materials have been formed and patterned by successive imaging steps. The precise registry of successive images in such multiple layers is extremely critical. Typically a precision alignment system is used to measure relative feature positions so that the current level is exposed in the correct position relative to the prior level.

Numerous alignment marks having a variety of sizes and shapes have been used in the industry to insure precise placement of the various levels in VLSI (very large scale integration) device fabrication, but those conventional alignment marks are not adequate in the context of this invention. Instead, this invention is concerned with a new type of alignment mark to be used in conjunction with e-beam imaging to identify specific locations on a chip.

As progressive shrinking of integrated circuits to submicron-sized features has developed, identifying and eliminating defects formed during wafer processing has become increasingly more important, and also more difficult. Previously used optical inspection of the devices is ineffective, laborious, and costly.

Fast response, high magnification inspection techniques are required to support rapid defect learning and to ensure device reliability, particularly during the product development phase. Automated e-beam wafer imaging tools with high resolution and large depth-of-focus have been developed in response to the need for rapid feedback on process or reticle defects which cannot be observed by conventional optical inspection. In general the imaging tools operate by rastering an e-beam across a wafer, and comparing the signal from a given position on chips to the same position on two adjacent chips.

An example of such inspection equipment is SEMSpec or ES20 from KLA-Tencor in San Jose, Calif. The automated inspection tools can operate in various modes, such as SEM (scanning electron microscopy) for inspection of physical defects, or in voltage contrast mode which detects abnormal voltage contrast levels.

Complete fabrication of a complex device often takes approximately 30 to 75 days; therefore it is important that defects be caught as early as possible during wafer processing in order to correct mask or reticle defects and/or process problems. Detection and correction of a defect early in the wafer processing cycle, rather than by circuit testing and failure analysis of the finished device can save significantly in product development costs and time.

E-beam inspection can shorten response time from 1 to 2 months for functional testing of a finished device, to 1 to 2 days for state-of-the-art e-beam inspection. (J. Garvin, M. Tinker, N. Sridhar, R. Guldi, R. Chappel, T. Cass and K. Roberts, "Fast Yield Learning Using E-Beam Wafer Inspection" SPIE International Symposium on Microelectronics and Assembly—Singapore Nov. 27, 2000, Vol.4229, p 85–91)

Frequently, complex integrated circuit devices include a number of repetitive arrays of circuit geometry, as well as a number of peripheral circuits which typically are not repetitive. Some devices, in particular SRAMs, may include in the peripheral and storage circuitry an area comprised solely of very small circular contact holes which provide a means for connection between different levels. The accuracy and precision of the contacts are critical to device functionality and reliability.

An array of contact holes or vias in peripheral circuitry presents a particularly difficult challenge for accurate SEM inspection because of their lack of different geometric features, small size, and the large number of similar circular holes having no alignment mark or other distinctive feature near-by to precisely identify a position on the chip.

The most accurate and rapid e-beam analysis and characterization of contact holes have been made possible by the voltage contrast operating mode which may detect electrical failures and/or defects not visible by optical techniques, in both the current and underlying layers. Voltage contrast imaging shows different contrast levels depending on the surface charge of the feature under inspection.

However, a significant issue with the application of automated e-beam imaging is that the inspection tools must have a means of locating the feature under inspection which is recognizable by the system, and is in close proximity to the area under inspection. In practice, features requiring analysis may be difficult to locate if they are in random geometric areas, and are comprised of contact holes.

Existing photolithographic alignment marks used primarily for assuring correct alignment between levels and correct size of features in active circuitry are typically placed in scribe streets between individual chips, and therefore due to their remote location are not useful for SEM inspection of many critical areas on a chip.

In particular, peripheral circuitry comprised of hole patterns may not be accurately inspected by e-beam imaging because a precise location is unidentifiable. Post processing analysis of contacts is both extremely difficult and unreliable because the complex contact holes have been filled, overlaid, and otherwise obscured during processing of multilayered structures, and therefore, it is of utmost importance that the contacts be analyzed and characterized during processing.

Thus, there is a need for a new type of alignment mark specifically to identify the precise location of critical features to be inspected by e-beam imaging during wafer processing, and in particular the location of features positioned in random geometries comprised of contact holes. Further, the means for identifying a location must be distinctive enough for SEM recognition. Such an alignment mark would help shorten development time and costs for integrated circuits, and therefore, would be beneficial to the entire semiconductor industry.

SUMMARY OF THE INVENTION

It is an object of the invention to provide alignment marks to be used in conjunction with e-beam imaging or SEM for rapid defect learning. These marks will be invaluable in shortening new product cycle time development, as well as characterization of existing processes.

It is an object of the invention to ensure that the alignment mark designs are recognizable by e-beam pattern recognition systems, and that the marks are large enough to be easily detected, but small enough to avoid conflict for active circuit space.

It is an object of the current invention to provide robust new alignment marks for e-beam inspection of wafers which will allow precise identification of feature locations in the area of inspection.

It is further an object of the invention to provide alignment marks which are positioned in close proximity to areas requiring inspection, including critical features in random geometries which may be comprised of contact hole patterns.

It is an object of the invention to include an alignment mark in each level having critical geometries, and specifically at each contact level or via hole on a wafer.

It is an object of the invention to avoid placing the alignment mark atop or under circuit patterns which may interfere with ease and accuracy of inspection.

It is further an object of the invention to compensate for drift within the imaging equipment by providing two alignment marks at opposite sides of an inspection area.

It is further an object of the invention that addition of the SEM alignment marks not increase the cost of wafer processing.

The above and other objectives are met by providing an alignment mark comprised of a unique "L" shaped pattern of geometric features, which is easily detected by the recognition system of e-beam imaging equipment, and is located in close proximity to the specific circuit features under investigation at each level to be inspected. The requirement for a design which is recognizable by state-of-the-art e-beam imaging systems includes a pattern having more that one 90 degree angle, a pattern having multiple geometric features within the alignment mark, unpatterned areas on the outer sides of the "L" shaped pattern, a mark which is large enough to be easily detected, and is placed in regions without under and over-lying circuit features. To further ensure that the alignment mark is easily distinguished from circuit patterns, the design includes duplicate geometric features within the alignment mark. Multiple alignment structures on each circuit pattern are added to identify instability within the measurement system. E-beam or SEM alignment marks are processed at each level having features requiring inspection. In particular, each contact and via hole process includes an alignment mark having individual feature sizes equal to the minimum contact size and spacing design of the circuit pattern.

The specific features and advantages of the invention will become apparent from the detailed description which proceeds with reference to the accompanying drawings.

BRIEF DESCRIPTION OF THE DRAWINGS

FIG. 7 outlines the method for design and use of an alignment mark in conjunction with e-beam imaging.

DETAILED DESCRIPTION OF THE DRAWINGS

Figure 1:
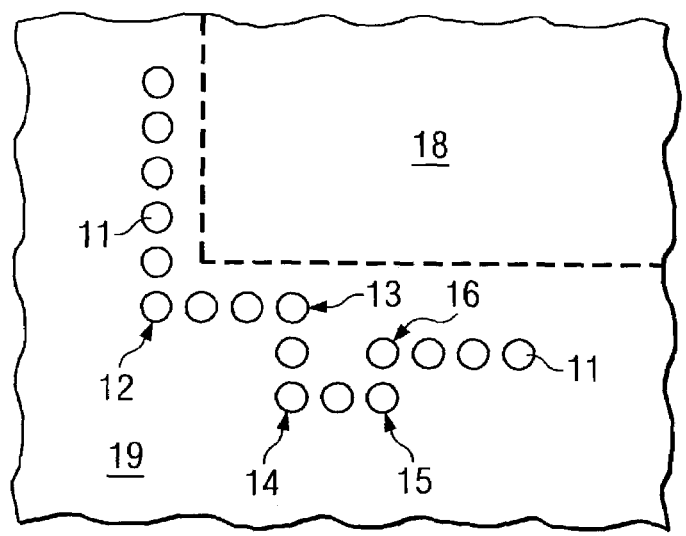
FIG. 1 demonstrates the unique "L" shape of an alignment mark for e-beam imaging.

FIG. 1 is an exemplary embodiment of a modified "L" shaped alignment mark 10 of this invention which is recognizable by state-of-the-art e-beam SEM imaging equipment. The alignment mark design is incorporated into the wafer mask or reticle for each step requiring inspection. A preferred embodiment includes the alignment mark at each contact and via hole patterning.

The alignment mark meets the necessary requirement for e-beam image detection and accurate identification of circuit feature locations. Primary requirements for an alignment structure are that it is large enough to be detected, that the outer sides of the "L" are in an unpatterned area, and that the mark is comprised of multiple features in a distinctive shape so that it will not be confused with circuit geometries, and that it includes 90 degree angles. The structure is not placed over or under patterned circuitry, and it is preferable that there is no underlying trench metal which can add interfere with definition of the alignment mark pattern.

It can be seen in FIG. 1 that the alignment structure 10 is comprised of multiple circular components 11. The modified "L" shaped pattern has multiple 90 degree angles, including a right angle "L" shaped corner 12, and corners 13, 14, 15, and 16 in the horizontal leg of the pattern forming a "u" shape near the center. Corner (90 degree) shapes are generally preferred for alignment structures, and the arrangement of multiple circular patterns to form the distinctive "L" shape is unlikely to be confused with circuit geometry.

The overall size of the alignment mark 10 is preferably about 10 microns by 10 microns, or a size easily detected by state-of-the-art imaging recognition systems. A mark of this size can be placed near the edge of an area of patterned circuitry without encroaching into the space required for circuitry, and yet be large enough to be useful for SEM analyses.

Alignment mark 10, placed near the edge of patterned circuitry 18, has clear, unpatterned space 19 at the outer sides of the "L" pattern, and therefore is easily detected by the pattern recognition system. Placement of the alignment mark at the outer edge of an area of circuitry 18 avoids underlying and overlying circuit patterns which could interfere with mark detection. It is preferable that there is no underlying trench metal which can interfere with definition of the pattern features because the etch technology is incompatible. Resolution of individual geometric features will be useful in providing information in the SEM analysis concerning process limitations.

Figure 2:
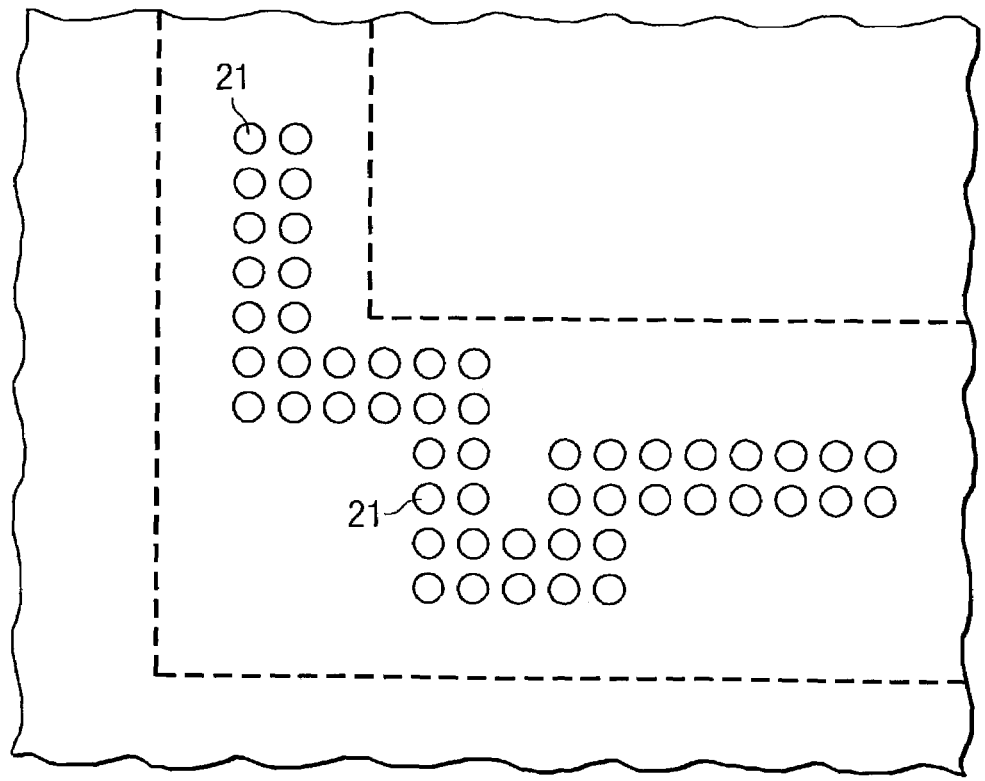
FIG. 2 shows the preferred pattern of duplicate holes in the alignment mark of the invention.

In FIG. 1 the modified "L" shape for an alignment mark is illustrated, and FIG. 2 details the preferred alignment mark 20 including a double row of hole patterns 21 in the distinctive "L" shaped array. Providing duplicate holes further precludes confusing the alignment mark with patterned circuitry.

State-of-the art circuits have patterned holes 11 of about 0.1 micron in diameter. In the preferred embodiment, individual patterned features are equal to the minimum contact size and spacing in the circuit design. Design rules may be expected to change with advances in technology, and therefore the individual feature sizes in the mark may change. Providing individual feature sizes in the alignment mark which are the same as those of the circuit assures similarity in process latitude, and supports the need for detection of process problems, such as incomplete patterning, etching, or contact filling.

It should be recognized that while the drawing in FIG. 2 represents the preferred design of a SEM alignment mark, specifically for contact and hole inspections, many variations are possible which include the prerequisite features as previously outlined for e-beam imaging, and these variations are included in the scope of the invention. Alternate shapes could include one or more steps in the vertical, rather than horizontal leg of an "L", or steps in both legs, or the steps could be in the opposite direction. Also, the circular features could be different geometric shapes.

Figure 3:
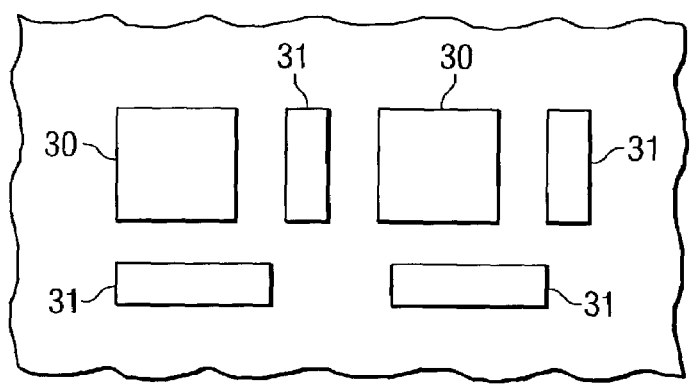
FIG. 3 is a diagram of a section showing the general layout of an SRAM device. (Prior art)

Complex integrated circuit designs, for example SRAMs, frequently include a repetitive array of geometries, such as memory circuits, and multiple blocks of logic circuits peripheral to the repetitive arrays. For example, FIG. 3 is a schematic representation of a portion of an integrated circuit, such as an SRAM, having a plurality of repetitive memory arrays 30 and associated peripheral logic circuitry 31. Repetitive geometric features within memory arrays provide designs whose location may be identified by SEM analyses, and therefore they do not present a significant challenge to defect analysis by e-beam imaging. However, the peripheral circuitry which includes random geometric patterns, and may also include an array of patterned contact holes having no distinctive features. Therefore the precise location of a defect in this arrangement is unidentifiable by e-beam imaging.

Figure 4A:
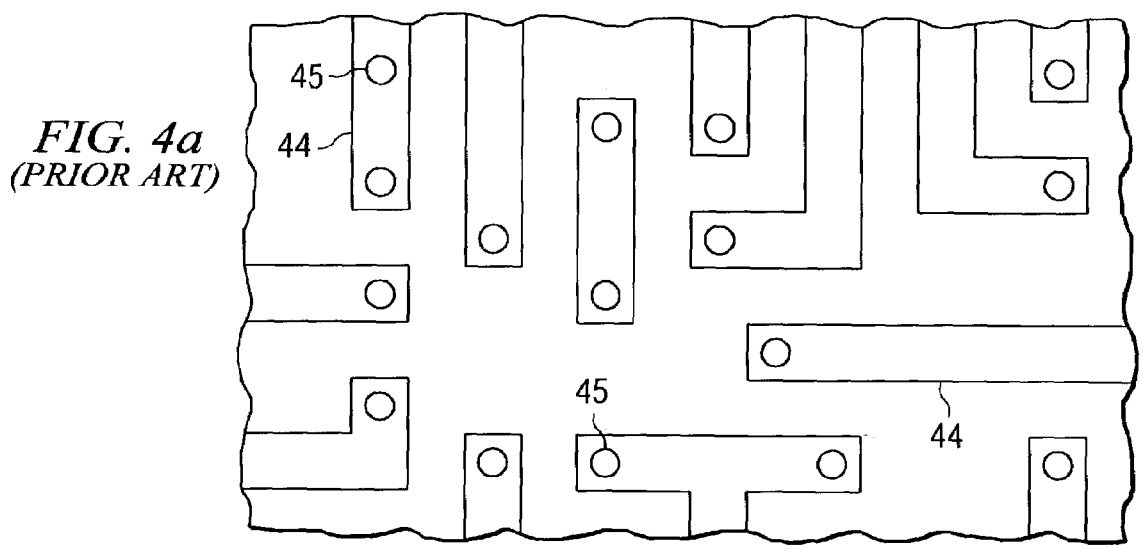
FIG. 4a illustrates an array of contact holes. (Prior art)

In order to more clearly demonstrate the issue, an example of a typical pattern of contact holes 45 overlying a grid work 44 of circuitry is illustrated from a top view in FIG. 4*a*. It can readily be seem that the density and similarity of such a series of contacts makes it very difficult to identify a specific defective contact without some form of alignment feature placed in close proximity to the area under surveillance. The small size of contact holes and vias, typically as small as 0.1 microns adds to the difficulty for analysis.

Figure 4B:
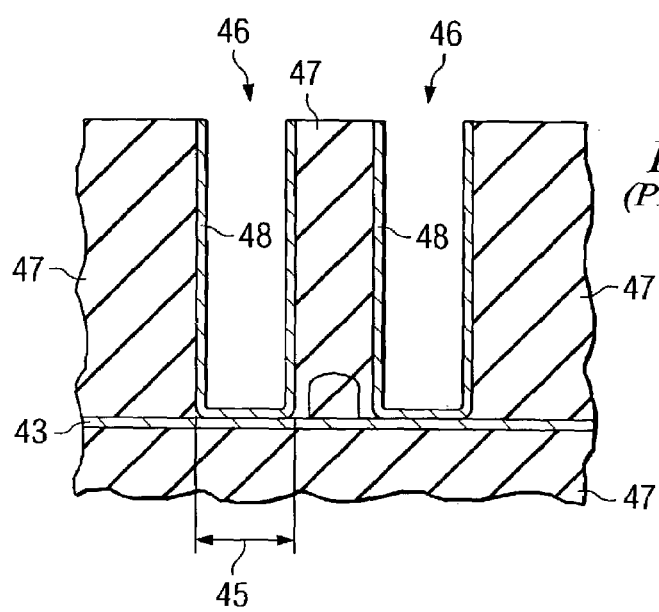
FIG. 4b is a cross section of a contact. (Prior art)

Holes are subsequently filled with a conductor to form contacts interconnecting various conductor or semiconductor levels. A cross section of a contact 45 in FIG. 4*b*, shows the outline 46 of holes or vias which are formed by photopatterning a layer of insulator 47, and etching to remove unwanted material forming a hole or via. Contact holes or vias are filled or lined with a conductor 48 to provide a conduction path between a lower conductor level 43, and a conductor to be deposited subsequently.

The e-beam SEM equipment functions by scanning across a known area on a chip and comparing that image to the same area on a chip on either side. Therefore, the precise location of the image must be identifiable. However, because the features under investigation are very small, any drift or instability within the instrument may lead to misinformation, and the amount of system error must be recognized and an allowance made. In order to assess the instrument stability, it is highly preferable that two alignment features be placed at known positions on opposite sides of the inspection area in order to measure and compensate for the amount of drift.

Figure 5:
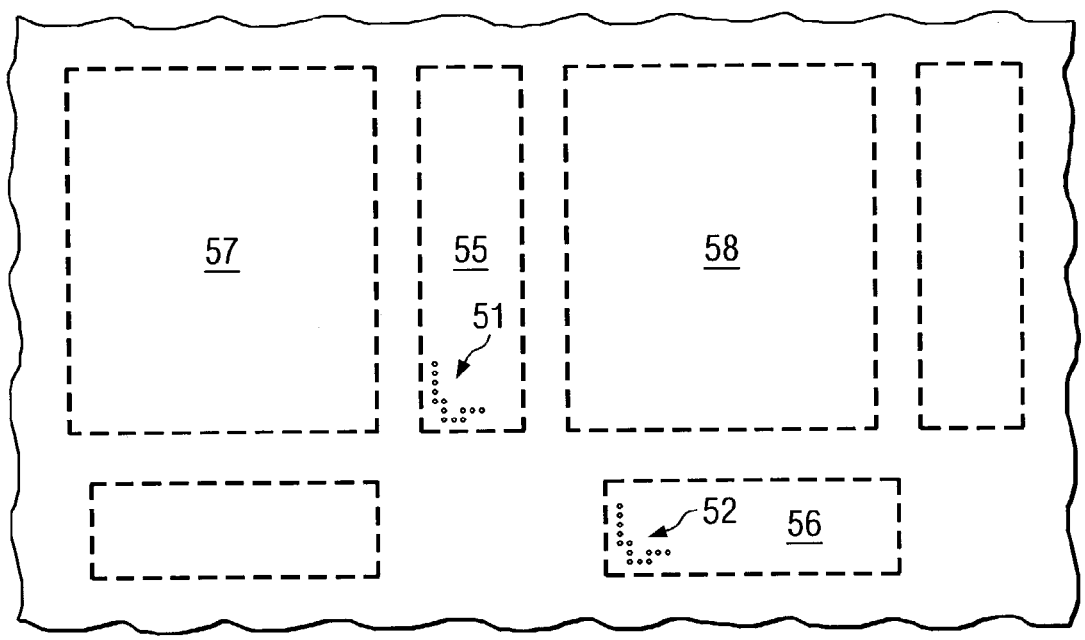
FIG. 5 illustrates a location for the alignment marks in one embodiment of the invention.

In accordance with one embodiment of the invention shown in FIG. 5 a pair of alignment marks 51, 52 are positioned at the lower left corners of peripheral circuitry blocks 55 and 56 respectively. These marks provide a reference for identifying precise locations relative to memory arrays 57 and 58, and to features within the peripheral circuitry 55, 56. By positioning the alignment marks at the bottom left corner of an area of peripheral circuitry it is possible to identify not only the location of features within that peripheral circuitry, but also those in the near-by arrays of repetitive circuitry.

Figure 6:
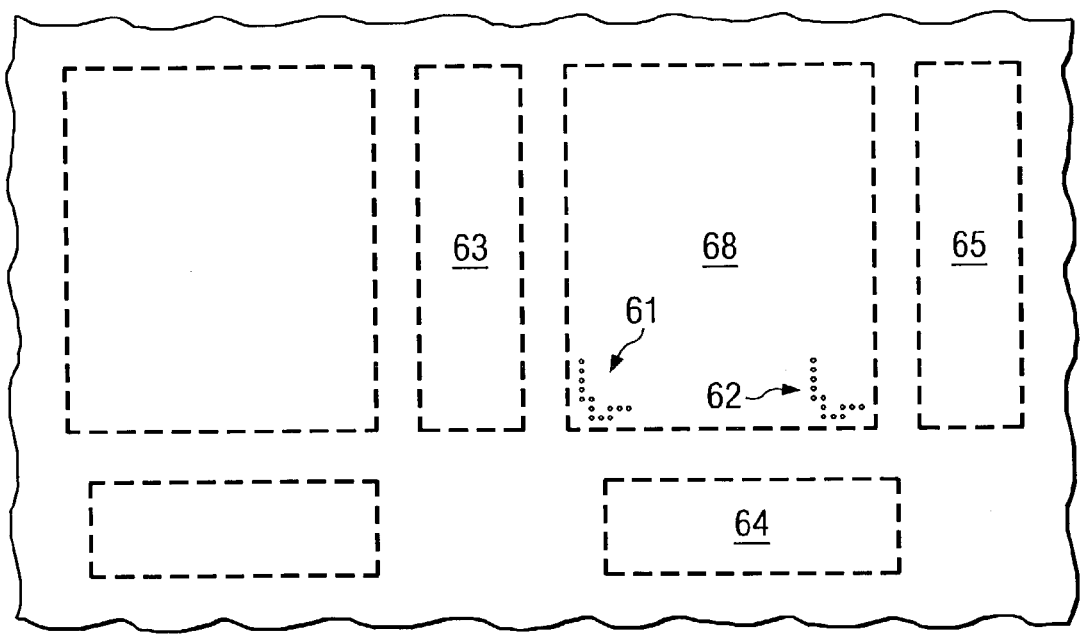
FIG. 6 illustrates the location of a pair of alignment marks in a second embodiment.

In an alternate embodiment shown in FIG. 6, a pair of alignment marks 61, 62 are positioned near the lower right and left corners of a memory circuit array 68. In this case, the areas for inspection would include the lower part of the array 68, as well as peripheral circuitry 63, 64, and 65.

It can be noted that the orientation of alignment marks 61 and 62 is the same. In the case of designs having a severe space constraint, the horizontal leg of the "L" shaped pattern could be turned 180 degrees so that it faces the alignment structure on the opposite corner. However, it is generally preferred that the patterns are identical so that the imaging equipment is "taught" only a single image.

The dual alignment marks in both FIGS. 5 and 6 help analyze any instrument drift or instability which may contribute to inaccuracies in SEM or voltage contrast analyses.

E-beam imaging and analysis of critical geometries may be made after each patterning step; therefore, an alignment mark specifically for SEM identification of defeats is included with each process step slated for analysis. The alignment mark design as shown in FIG. 2 is preferably included in each contact and via level.

The location of alignment marks has been described using a chip having repetitive circuitry, such as an SRAM. However, it should be recognized that the invention is not limited to this type of circuitry, but instead that it is applicable and recommended for all integrated circuits, and that the alignment structures should be placed in close proximity to any critical area to be inspected.

It should further be noted that while the preferred embodiment of the alignment structure is a pattern of holes which emulate contacts, the individual features within an alignment mark are not necessarily circular, and the features on the chip to be inspected are not necessarily contacts, but instead could be any critical geometry, and the features could be "x" 's, triangles or any-other shape which would provide geometric sizes similar to the circuit features to be e-beam imaged.

It is necessary that an e-beam imaging alignment structure include the required features, namely, (a) a unique pattern sufficiently large enough to be easily detected by the pattern recognition system of the e-beam equipment, (b) the pattern must include a plurality of geometric features arrayed to form multiple 90 degree angles, (c) the mark must be surrounded by clear, unpatterned areas, and (d) the mark must be positioned in close proximity to the area of inspection.

The technique recognized by the industry for best detecting and identifying abnormalities or defects on an in-process semiconductor chips makes use of e-beam imaging. The method providing by this invention for precise location of the defect is to include a unique alignment mark on each chip in close proximity to critical geometries to be inspected at each patterning step. Contact and via holes are critical circuit geometries, and are used in the outline in FIG. 7 to provide an exemplary methodology for the invention.

The first step defines the requirement for a unique alignment mark recognizable by e-beam, and easily distinguished from circuit patterns. Those requirements include the following; a) mark size of about 10×10 microns, b) the mark is placed in a clear, unpatterned area with no circuit features atop or under the mark, c) multiple geometric features arrayed in a modified "L" shaped pattern including more that one 90 degree angle, and d) the geometric features, preferably circles are consistent with minimum circuit design rules in size and spacing.

The next step defines the location of the alignment marks to be in close proximity to critical circuit features requiring inspection. Preferably two marks are placed near the edges of an area to be inspected. In an SRAM device, the marks are near peripheral circuitry.

Next, the mask or reticle is designed to include a pair of unique alignment marks in each pattern of the circuit to be inspected, for example each contact or via pattern.

A wafer, including patterned SEM alignment marks, is processed through the hole defining steps.

Finally, as the critical area of the wafer is e-beam scanned, and if a defect is detected, the defect or abnormality is precisely located with reference to the alignment mark, thereby, allowing the source of the defect to be analyzed. The technique for identifying specific locations is particularly useful in the case of holes located in random geometries which otherwise would be difficult to study.

It should be noted that the addition of alignment marks to be used in conjunction with e-beam imaging adds no cost to chip processing, and that the cost of including the design in the mask is easily overcome by the cycle time reduction afforded by early defect learning.

An alignment mark specifically for use with e-beam imaging, and a method for detecting and locating contact or via hole defects by use of the alignment mark has been described. However, various changes could be made to the mark design and use without departing from the scope and spirit of the invention. It is intended that all matter contained in the above descriptions and drawings shall be interpreted as illustrative and not in a limiting sense.

What is claimed is:

1. A semiconductor wafer having an alignment mark for use with e-beam imaging to identify specific locations on a semiconductor chip including;

a unique pattern large enough to be detected by the recognition system of e-beam imaging equipment, said pattern comprising a plurality of geometric features, said mark including a straight vertical component, and a horizontal component at a right angle wherein one or more of said geometric features is out of alignment, thereby forming a "u" shape near the center of said horizontal component, said mark surrounded by a clear, unpatterned area on the chip, and said mark positioned in close proximity to a circuit feature to be inspected.

2. A semiconductor wafer as in claim 1 wherein the area is approximately 10 microns by 10 microns or less.

3. A semiconductor wafer as in claim 1 formed at each contact or via printing step in wafer processing.

4. A semiconductor wafer as in claim 1 wherein duplicate marks are included in each chip on opposite sides of the inspection area.

* * * * *